US012775409B2

(12) United States Patent
Lien et al.

(10) Patent No.: US 12,775,409 B2
(45) Date of Patent: Oct. 27, 2026

(54) PROGRAMMING DATA IN MEMORY

(71) Applicant: Micron Technology, Inc., Boise, ID (US)

(72) Inventors: Yu-Chung Lien, San Jose, CA (US); Jun Wan, San Jose, CA (US); Zhenming Zhou, San Jose, CA (US); Ying Tai, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 18/786,100

(22) Filed: Jul. 26, 2024

(65) Prior Publication Data

US 2025/0130731 A1 Apr. 24, 2025

Related U.S. Application Data

(60) Provisional application No. 63/544,700, filed on Oct. 18, 2023.

(51) Int. Cl.

*G11C 16/10* (2006.01)
*G06F 3/06* (2006.01)
*G11C 16/34* (2006.01)

(52) U.S. Cl.

CPC .......... *G06F 3/0644* (2013.01); *G06F 3/0604* (2013.01); *G06F 3/0679* (2013.01); *G11C 16/10* (2013.01); *G11C 16/34* (2013.01); *G11C 16/3459* (2013.01)

(58) Field of Classification Search

CPC ... G11C 16/0483; G11C 16/102; G11C 16/08; G11C 16/26; G11C 16/32

See application file for complete search history.

(56) References Cited

U.S. PATENT DOCUMENTS

| | | | | |
|---|---|---|---|---|
| 7,308,525 | B2 * | 12/2007 | Lasser | G11C 16/0483 365/185.33 |
| 10,120,604 | B1 * | 11/2018 | Srinivasan | G06F 12/0868 |
| 10,446,237 | B1 * | 10/2019 | Luo | G11C 16/3495 |
| 10,650,896 | B1 * | 5/2020 | Yang | G11C 11/5628 |
| 11,222,710 | B1 | 1/2022 | Chen et al. | |
| 11,231,870 | B1 | 1/2022 | Chen et al. | |
| 11,635,794 | B2 | 4/2023 | Chen et al. | |
| 2008/0031041 | A1 * | 2/2008 | Han | G11C 16/0483 365/185.03 |
| 2008/0043527 | A1 * | 2/2008 | Aritome | G11C 5/04 365/185.17 |
| 2022/0415418 | A1 * | 12/2022 | Chu | G11C 16/08 |

(Continued)

*Primary Examiner* — Mushfique Siddique
(74) *Attorney, Agent, or Firm* — Brooks, Cameron & Huebsch, PLLC

(57) ABSTRACT

Programming data in memory is described herein. An example apparatus includes an array of memory cells having a plurality of access lines to which the cells are coupled, and a processing device that performs a program operation on the array, including programming data to be stored in one page of cells of the array to the cells of the array coupled to a first one of the access lines, programming additional data to be stored in that page to the cells of the array coupled to a second one of the access lines adjacent to the first one of the access lines, sensing the data programmed to the cells of the array coupled to the first one of the access lines, and programming data to be stored in two pages of cells of the array to the cells of the array coupled to the first one of the access lines.

17 Claims, 6 Drawing Sheets

(56) References Cited

U.S. PATENT DOCUMENTS

| | | | |
|---|---|---|---|
| 2023/0393752 A1 | 12/2023 | Zhou et al. | |
| 2023/0395176 A1 | 12/2023 | Huang et al. | |
| 2024/0070021 A1 | 2/2024 | Lien et al. | |
| 2024/0071509 A1 * | 2/2024 | Yang .................. | G11C 16/3459 |

* cited by examiner

350

| # Reads | Page | L0 | L1 | L2 | L3 | L4 | L5 | L6 | L7 |
|---|---|---|---|---|---|---|---|---|---|
| 3 | Extra | 1 | 0 | 0 | 1 | 1 | 1 | 0 | 0 |
| 3 | Upper | 1 | 1 | 0 | 0 | 0 | 1 | 1 | 0 |
| 1 | Lower | 1 | 1 | 1 | 1 | 0 | 0 | 0 | 0 |

V1 V2 V3 V4 V5 V6 V7

*FIG. 3*

PROGRAMMING DATA IN MEMORY

PRIORITY INFORMATION

This application claims the benefits of U.S. Provisional Application No. 63/544,700, filed on Oct. 18, 2023, the contents of which are incorporated herein by reference.

TECHNICAL FIELD

Embodiments of the disclosure relate generally to memory sub-systems, and more specifically, relate to programming data in memory.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3 is a table illustrating a conceptual example of coding that can be used for sensing data that has been programmed to memory cells during a program operation in accordance with some embodiments of the present disclosure.

DETAILED DESCRIPTION

Figure 1:
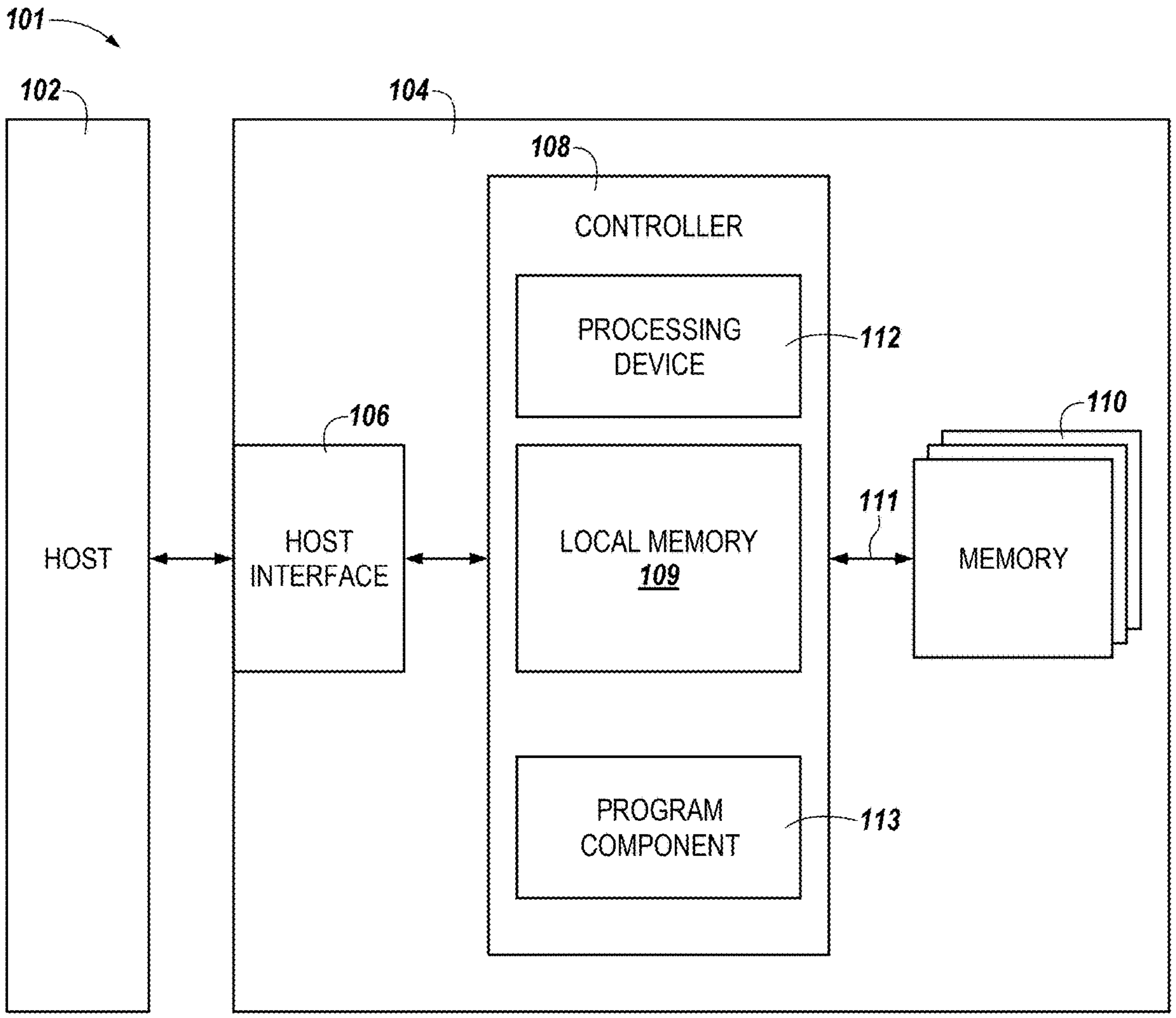
FIG. 1 illustrates an example computing environment that includes a memory sub-system in accordance with some embodiments of the present disclosure.

Aspects of the present disclosure are directed to programming data in memory. An example apparatus includes a memory component including an array of memory cells, wherein the array includes a plurality of access lines to which the memory cells are coupled, and a processing device coupled to the memory component and configured to perform a program operation on the array of memory cells, wherein the program operation includes programming data to be stored in one page of memory cells of the array to the memory cells of the array coupled to a first one of the plurality of access lines, programming additional data to be stored in the one page of memory cells of the array to the memory cells of the array coupled to a second one of the plurality of access lines, wherein the second one of the plurality of access lines is adjacent to the first one of the plurality of access lines, sensing the data programmed to the memory cells of the array coupled to the first one of the plurality of access lines, and programming data to be stored in two pages of memory cells of the array to the memory cells of the array coupled to the first one of the plurality of access lines.

In various memory sub-systems, programming memory cells can involve providing a programming signal to a group of cells (e.g., a page) to place them in target states, which correspond to respective stored data patterns. For example, the cells can be non-volatile flash memory cells configured to store one or more bits of data per cell. To program a selected memory cell of a page, a programming signal (e.g., voltage) can be applied to the access (e.g., word) line coupled to that memory cell.

Some types of memory cells, however, such as, for instance, NAND flash memory cells, may be vulnerable to a coupling to coupling (C2C) effect during programming. A coupling to coupling effect can involve and/or refer to an adverse effect that the programming of a selected memory cell (e.g., the programming signal applied to the access line coupled to the selected memory cell) can have on the adjacent (e.g., neighboring) access lines (e.g., the access lines that are adjacent to the access line coupled to the selected memory cell), and can adversely affect the performance of the memory. For instance, the coupling to coupling effect can reduce the cell scaling of the memory.

Embodiments of the present disclosure, however, can address the above and other deficiencies by reducing (e.g., mitigating) the coupling to coupling effect during memory programming. For example, programming memory (e.g., NAND flash memory) in accordance with the present disclosure can reduce the coupling to coupling effect by half as compared with previous programing approaches, which can increase the cell scaling of the memory. Further, embodiments of the present disclosure can reduce the coupling to coupling effect without otherwise adversely affecting the performance of the memory. For example, embodiments of the present disclosure can reduce the coupling to coupling effect without significantly increasing the amount of time needed to program the memory.

FIG. 1 illustrates an example computing environment 101 that includes a memory sub-system 104 in accordance with some embodiments of the present disclosure. The memory sub-system 104 can include media, such as memory components 110. The memory components 110 can be volatile memory components, non-volatile memory components, or a combination of such. In some embodiments, the memory sub-system is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

The host system 102 can be a computing device such as a personal laptop computer, a desktop computer, a digital camera, a mobile telephone, or a memory card reader, among various other types of hosts. The host system 102 can include or be coupled to the memory sub-system 104 (e.g., via a host interface 106) so that the host system 102 can read data from or write data to the memory subsystem 104. As used herein, "coupled to" generally refers to a connection between components, which can be an indirect communicative connection or direct communicative connection (e.g., without intervening components), whether wired or wireless, including connections such as electrical, optical, magnetic, etc. The host interface 106 can be a physical interface, examples of which include, but are not limited to, a serial advanced technology attachment (SATA) interface, a peripheral component interconnect express (PCIe) interface, universal serial bus (USB) interface, Fibre Channel, Serial Attached SCSI (SAS), etc. The host interface 106 can be used to transmit data between the host system 102 and the memory sub-system 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102. The memory components 110 can include a number of arrays of memory cells (e.g., non-volatile memory cells). The arrays can be flash arrays with a NAND architecture, for example. For instance, the arrays can include a plurality (e.g., decks) of access (e.g., word) lines to which the memory cells of the arrays are coupled, with each respective one of the plurality of access lines corresponding to a different vertical level (e.g., tier) of the array. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device can be configured to store 8 KB (kilobytes) of user data per page, 128 pages of user data per block, 2048 blocks per plane, and 16 planes per device. The memory components 110 can also include additional circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include various combinations of the different types of non-volatile memory components and/or volatile memory components. An example of non-volatile memory components includes a negative-and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

As illustrated in FIG. 1, the memory sub-system 104 can include a controller 108 coupled to the host interface 106 and to the memory components 110 via a memory interface 111. The controller 108 can be used to send data between the memory sub-system 104 and the host 102. The memory interface 111 can be one of various interface types compliant with a particular standard such as Open NAND Flash interface (ONFi).

The controller 108 can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field-programmable gate array (FPGA), an application-specific integrated circuit (ASIC), etc.), or other suitable processor. The controller 108 can include a processing device 112 (e.g., processor) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code.

While the example memory sub-system 104 in FIG. 1 has been illustrated as including the controller 108, in another embodiment of the present disclosure, a memory sub-system 104 may not include a controller 108, and can instead rely upon external control (e.g., provided by an external host, such as by a processing device separate from the memory sub-system 104).

The controller 108 can use and/or store various operating parameters associated with operating (e.g., programming and/or reading) the memory cells. Such operating parameters may be referred to as trim values and can include programming pulse magnitude, step size, pulse duration, program verify voltages, read voltages, etc. for various different operating processes. The different processes can include processes to program cells to store different quantities of bits, and different multiple pass programming process types (e.g., 2-pass, 3-pass, etc.). The controller 108 can be responsible for other operations such as wear leveling operations, garbage collection operations, error detection and/or correction (e.g., error-correcting code (ECC)) operations, encryption operations, caching operations, and address translations between a logical block address and a physical block address that are associated with the memory components 110.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry can receive an address from the controller 108 and decode the address to access the memory components 110.

In various embodiments, the controller 108 can include a program component 113 to perform program operations (e.g., two-pass program operations) on the arrays of memory cells of memory components 110 in accordance with the present disclosure. Such program operations can have a reduced (e.g., mitigated) coupling to coupling effect as compared with previous program operations, as previously described herein.

In an example program operation (which may be referred to herein as Example 1), controller 108 (e.g., program component 113) can load data to be stored in one (e.g., a lower) page of memory cells of an array, and program that data (which can be referred to as data 0) to the memory cells of the array coupled to a first one of the plurality of access (e.g., word) lines of the array (which can be referred to as WL0). Controller 108 can then (e.g., after programming data 0) load additional data to be stored in the lower page of memory cells, and program that additional data (which can be referred to as data 1) to the memory cells of the array coupled to a second one of the plurality of word lines (which can be referred to as WL1) that is directly adjacent to (e.g., next to and/or neighboring) WL0 in the array. Controller 108 can then (e.g., after programming data 1) load data to be stored in two pages (e.g., an upper page and an extra page) of memory cells of the array, and sense (e.g., read back) the data 0 that was programmed to the memory cells of the array coupled to WL0 after loading the data to be stored in the upper and extra pages (which can be referred to as data 2,3). Controller can then (e.g., after reading back the data 0 programmed to the cells coupled to WL0) program data 2,3 to the memory cells of the array coupled to WL0. Controller 108 can then (e.g., after programming data 2,3) load additional data to be stored in the lower page of memory cells, and program that additional data (which can referred to as data 4) to the memory cells of the array coupled to a third one of the plurality of word lines (which can be referred to as WL2) that is directly adjacent to (e.g., next to and/or neighboring) WL1 in the array. Controller 108 can then (e.g., after programming data 4) load additional data to be stored in the upper and extra pages of memory cells, and sense (e.g., read back) the data 1 that was programmed to the memory cells of the array coupled to WL1 after loading the additional data to be stored in the upper and extra pages (which can be referred to as data 5,6). Controller 108 can then (e.g., after reading back the data 1 programmed to the cells coupled to WL1) program data 5,6 to the memory cells of the array coupled to WL1. The program operation can continue in an analogous manner (e.g., moving back and forth between adjacent access lines) for a selected portion (e.g., only the selected portion) of the plurality of access lines of the array. The portion of the plurality of access lines can be selected (e.g., pre-determined) by controller 108, as will be further described herein.

In another example program operation (which may be referred to herein as Example 2), controller 108 (e.g., program component 113) can load data to be stored in one (e.g., a lower) page of memory cells of the array, and program that data to the memory cells of the array coupled to each (e.g., all) of a plurality of adjacent access (e.g., word) lines of the array. For instance, if the plurality of adjacent word lines comprises seven word lines, data 0 can be programmed to a first one of the seven word lines (e.g., WL0), data 1 can be programmed to a second one of the seven word lines (e.g., WL1), data 2 can be programmed to a third one of the seven word lines (e.g., WL2), and so on, through data 6 being programmed to the last (e.g., seventh) word line (e.g., WL6). Controller can then (e.g., after programming the data to be stored in the lower page) load data to be stored in two pages (e.g., an upper page and an extra page) of memory cells of the array, and program that data to the memory cells of the array coupled to each of the plurality of adjacent access lines of the array. Continuing in the previous illustration, data 7,8 can be programmed to WL0, data 9,10 can be programmed to WL1, data 11,12 can be programmed to WL2, and so on, through data 19,20 being programmed to WL6. The plurality of adjacent word lines can comprise a portion (e.g., only a portion) of the plurality of access lines of the array, and can be selected (e.g., pre-determined) by controller 108, as will be further described herein.

In both example program operations (e.g., Examples 1 and 2), the data to be stored in the one (e.g., lower) page of memory cells of the array can be single level cell (SLC) data, and the programming of this data can be referred to as a first pass of the program operation. That is, the data that is to be stored in the lower page of memory cells and is programmed to the cells of the array coupled to each respective word line during the first pass can each comprise one bit of data. Further, the data to be stored in the two (e.g., upper and extra) pages of memory cells of the array can be multi-level cell (MLC) data, and the programming of this data can be referred to as a second pass of the program operation. That is, the data that is to be stored in the upper and extra pages of memory cells and is programmed to the cells of the array coupled to each respective word line during the second pass can each comprise two bits of data (e.g., one bit for the upper page, and one bit for the extra page). An example illustrating the data that can be programmed to the cells of the array will be further described herein (e.g., in connection with FIG. 2).

In both example program operations, the portion of the plurality of access lines selected by controller 108 for the program operation can comprise less than all of the access lines of the array, and can be referred to herein as a zone (e.g., a word line zone). As an example, controller 108 can select the zone for the program operation based on the error rate (e.g., bit error rate) associated with the zone (e.g., the error rate associated with the data stored by the memory cells coupled to the word lines of the zone). For instance, controller 108 can select the zone for the program operation if the error rate associated with the zone meets or exceeds a particular error rate threshold. For instance, controller 108 can select the zone of word lines having the highest (e.g., worst) error rate as the zone for the program operation. As an additional example, controller 108 can select the zone for the program operation based on the temperature (e.g., the operational environment temperature) of the zone. For instance, controller can select the zone for the program operation if the temperature of the zone is within a particular temperature range, such as, for instance, less than 0 degrees Celsius, between 0 and 85 degrees Celsius, or less than 85 degrees Celsius. Embodiments of the present disclosure are not limited to a particular temperature range, however.

In some embodiments, controller 108 can perform an additional program operation on the array in which additional data to be stored in additional pages of memory cells of the array is programmed to the memory cells of the array coupled to the access lines of the array that are not included in the portion of the plurality of access lines (e.g., the remaining word lines that are not included in the selected zone). The additional program operation can be a different type of program operation than example program operations 1 and 2 described above, such as, for instance, a one-pass program operation. An illustration of such an example will be further described herein (e.g., in connection with FIG. 4A).

In some embodiments, controller 108 can perform an additional program operation on the selected zone (e.g., on the memory cells coupled to the word lines of the selected zone) to program additional (e.g., different) data to the lower, upper, and/or extra pages of memory cells of the array. The additional program operation can be analogous to example program operation 1 described above, or analogous to example program operation 2 described above. That is, different example program operations (both 1 and 2) can be performed on the same word line zone of the array, or only the same example program operation (1 or 2) can be performed on the same word line zone of the array.

In some embodiments, controller 108 can select an additional portion of the plurality of access lines of the array for an additional program operation, and perform the additional program operation on those access lines (e.g., to program data to the memory cells coupled to those access lines). The additional portion of access lines may be included in a different deck of the array than the portion of access lines selected for example program operation 1 or 2 (e.g., the word line zone selected for example program operation 1 or 2 can be included in a first deck of the array, and the word line zone selected for the additional program operation can be included in a second deck of the array).

The additional program operation can be analogous to example program operation 1 described above, or analogous to example program operation 2 described above. As an example, example program operation 1 or example program operation 2 can be performed on both of the selected word line zones. That is, the same example program operation (1 or 2) can be performed on multiple word line zones of the array to program data to the memory cells of those zones. As an additional example, example program operation 1 can be performed on one of the selected word line zones, and example program operation 2 can be performed on the other one of the selected word line zones. That is, different example program operations (1 or 2) can be performed on different word line zones of the array to program data to the memory cells of those zones. An illustration of such examples will be further described herein (e.g, in connection with FIG. 4B).

Figure 2:
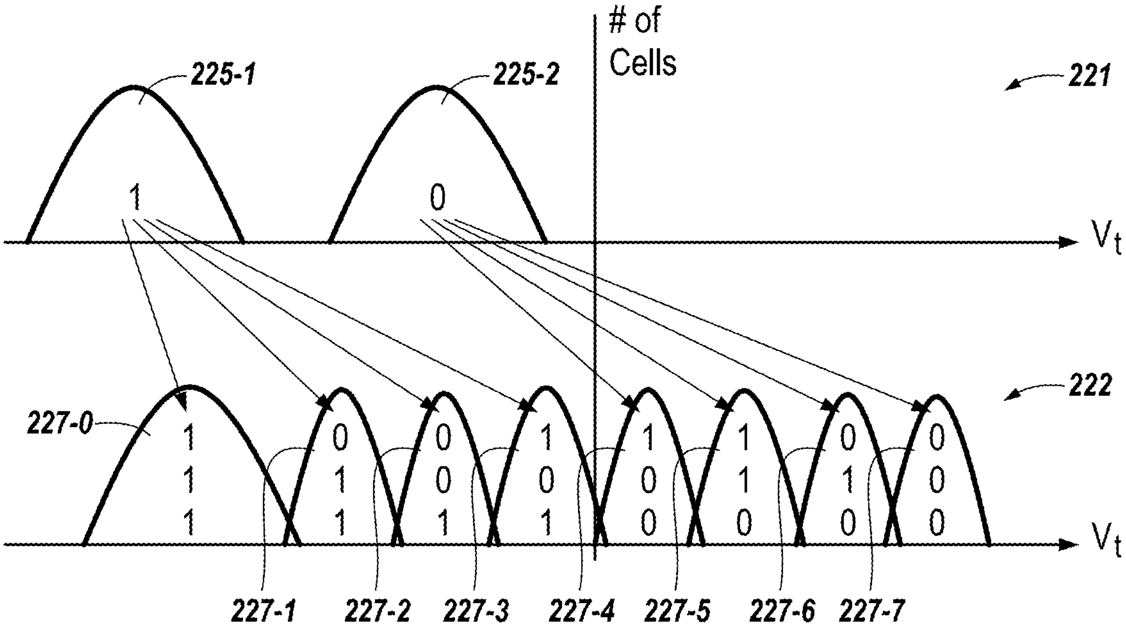
FIG. 2 is a conceptual example of data that can be programmed to memory cells during a program operation in accordance with some embodiments of the present disclosure.

FIG. 2 is a conceptual example of data that can be programmed to memory cells (e.g., the memory cells of an array of memory components 110) during a program operation (e.g., a two-pass program operation) in accordance with some embodiments of the present disclosure. For example, diagram 221 illustrates data that can be programmed to the memory cells during a first pass of the program operation, and diagram 222 illustrates data that can be programmed to the memory cells during a second pass of the program operation. For instance, diagram 221 illustrates threshold voltage (Vt) distributions 225-1 and 225-2 (which may collectively be referred to herein as Vt distributions 225) associated with the data states of the memory cells of a lower page of memory cells, and diagram 222 illustrates Vt distributions 227-1, 227-2, . . . , 227-8 (which may collectively be referred to herein as Vt distributions 227) associated with the data states of the memory cells of an upper page and an extra page of memory cells.

As an example, the two Vt distributions 225 in diagram 221 can correspond to single level (e.g., two state) memory cells, and the eight Vt distributions 227 in diagram 222 can correspond to multi-level memory cells (e.g., TLCs). Vt distributions 225-1 and 225-2 can represent two target data states (e.g., 1 and 0, respectively) to which the memory cells of the lower page can be programmed, and Vt distributions 227 can represent four target data states (e.g., 11, 10, 00, 01) to which the memory cells of the upper and extra pages, respectively, can be programmed. For instance, in the example illustrated in FIG. 2, Vt distribution 227-1 represents memory cells of the lower page that have been programmed to target data state 1, memory cells of the upper page that have been programmed to target data state 1, and memory cells of the extra page that have been programmed to target data state 1. Further, Vt distribution 227-2 represents memory cells of the lower page that have been programmed to target data state 1, memory cells of the upper page that have been programmed to target data state 1, and memory cells of the extra page that have been programmed to target data state 0. Further, Vt distribution 227-3 represents memory cells of the lower page that have been programmed to target data state 1, memory cells of the upper page that have been programmed to target data state 0, and memory cells of the extra page that have been programmed to target data state 0. Further, Vt distribution 227-4 represents memory cells of the lower page that have been programmed to target data state 1, memory cells of the upper page that have been programmed to target data state 0, and memory cells of the extra page that have been programmed to target data state 1. Further, Vt distribution 227-5 represents memory cells of the lower page that have been programmed to target data state 0, memory cells of the upper page that have been programmed to target data state 0, and memory cells of the extra page that have been programmed to target data state 1. Further, Vt distribution 227-6 represents memory cells of the lower page that have been programmed to target data state 0, memory cells of the upper page that have been programmed to target data state 1, and memory cells of the extra page that have been programmed to target data state 1. Further, Vt distribution 227-7 represents memory cells of the lower page that have been programmed to target data state 0, memory cells of the upper page that have been programmed to target data state 1, and memory cells of the extra page that have been programmed to target data state 0. Further, Vt distribution 227-8 represents memory cells of the lower page that have been programmed to target data state 0, memory cells of the upper page that have been programmed to target data state 0, and memory cells of the extra page that have been programmed to target data state 0. Embodiments of the present disclosure, however, are not limited to these particular data assignments.

Vt distributions 225 and 227 can represent a quantity (e.g., number) of memory cells that are programmed to the corresponding target data states, with the height of a Vt distribution curve indicating the quantity of cells programmed to a particular voltage within the Vt distribution (e.g., on average). The width of the Vt distribution curve indicates the range of voltages that represent a particular target state (e.g., the width of Vt distribution curve 227-2 represents the range of voltages that correspond to data values of 1, 1, and 0 for the lower, upper, and extra pages, respectively).

During a sense (e.g., read) operation to determine the respective data states stored by the memory cells of the lower, upper, and extra pages, reference voltages located between the Vt distributions can be used to distinguish between the data states. For example, during a sense operation performed on a memory cell of one of the pages, a sense voltage can be applied to the access (e.g., word) line to which the memory cell is coupled, and the resulting voltage signal (e.g. in response to the sense voltage being applied to the access line) from the memory cell can be provided to sense circuitry via a sense (e.g., bit) line to which the memory cell is coupled for comparison with one of the reference voltages. The data state for the memory cell can be determined using (e.g., by comparing) the voltage signal from that memory cell and the reference voltage. An example illustrating coding for the reference voltages used in such a sense operation will be further described herein (e.g., in connection with FIG. 3).

FIG. 3 is a table 350 illustrating a conceptual example of coding that can be used for sensing data that has been programmed to memory cells (e.g., the memory cells of an array of memory components 110 previously described in connection with FIG. 1) during a program operation (e.g., a two-pass program operation) in accordance with some embodiments of the present disclosure. The coding can be implemented in controller 108 (e.g., program component 113) previously described in connection with FIG. 1, for example.

Columns L0, L1, L2, . . . , L6, and L7 of table 350 can correspond to Vt distributions 227-0, 227-1, 227-2, . . . , 227-6, and 227-7, respectively, previously described in connection with FIG. 2. For instance, as shown in FIG. 3, column L0 can correspond to Vt distribution 227-0 in which memory cells of the lower page have been programmed to target data state 1, memory cells of the upper page have been programmed to target data state 1, and memory cells of the extra page have been programmed to target data state 1; column L1 can correspond to Vt distribution 227-1 in which memory cells of the lower page have been programmed to target data state 1, memory cells of the upper page have been programmed to target data state 1, and memory cells of the extra page have been programmed to target data state 0; column L2 can correspond to Vt distribution 227-2 in which memory cells of the lower page have been programmed to target data state 1, memory cells of the upper page have been programmed to the target data state 1, and memory cells of the extra page have been programmed to target data state 0; and so on, through column L7 which can correspond to Vt distribution 227-7 in which memory cells of the lower page have been programmed to target data state 0, memory cells of the upper page have been programmed to target data state 0, and memory cells of the extra page have been programmed to target data state 0.

The "#Reads" column of table 350 can indicate the number of sense (e.g., read) attempts performed on the memory cells of the lower page, the memory cells of the upper page, and the memory cells of the extra page, respectively, to sense the data stored by the memory cells during a sense operation. For instance, as shown in FIG. 3, one read attempt is performed on the memory cells of the lower page using one reference voltage (e.g., by applying that reference voltage to the memory cells of the lower page), three read attempts are performed on the memory cells of the upper page using three different reference voltages (e.g., by applying the three different reference voltages to the memory cells of the upper page), and three read attempts are performed on the memory cells of the extra page using three different reference voltages (e.g., by applying the three different reference voltages to the memory cells of the extra page). As such, the coding example illustrated in FIG. 3 can be referred to as 133 coding.

During a sense operation performed using the 133 coding example illustrated in FIG. 3, a first read attempt can be performed on the memory cells of the lower page using reference voltage V4 located between Vt distributions 227-3 and 227-4, as shown in FIG. 3. Further, a second read attempt can be performed on the memory cells of the upper page using reference voltage V2 located between Vt distributions 227-1 and 227-2, a third read attempt can be performed on the memory cells of the upper page using reference voltage V5 located between Vt distributions 227-4 and 227-5, and a fourth read attempt can be performed on the memory cells of the upper page using reference voltage V7 located between Vt distributions 227-6 and 227-7, as shown in FIG. 3. Further, a fifth read attempt can be performed on the memory cells of the extra page using reference voltage V1 located between Vt distributions 227-0 and 227-1, a sixth read attempt can be performed on the memory cells of the extra page using reference voltage V3 located between Vt distributions 227-2 and 227-3, and a seventh read attempt can be performed on the memory cells of the extra page using reference voltage V6 located between Vt distributions 227-5 and 227-6, as shown in FIG. 3.

In contrast to the 133 coding of the present disclosure, some previous approaches may utilize 124 coding for sensing data. In such a 124 coding approach, one read attempt may be performed on the memory cells of a lower page using one reference voltage, two read attempts may be performed on the memory cells of an upper page using two different reference voltages, and four read attempts may be performed on the memory cells of an extra page using four different reference voltages. However, in such a 124 coding approach, one of the four reference voltages used on the extra page would be located between Vt distributions 227-0 and 227-1, and another one of the four reference voltages used on the extra page would be located between Vt distributions 227-6 and 227-7. Using those two reference voltages on the same page (e.g., the extra page) can reduce the reliability of (e.g., increase the amount of errors in) the data read from that page during the sense operation. In contrast, in the 133 coding approach of the present disclosure, those two reference voltages are used on separate pages (e.g., reference voltage V1 is used on the extra page, and reference voltage V7 is used on the upper page). As such, the data read during a sense operation performed using the 133 coding approach of the present disclosure can have an increased reliability (e.g., a lower number of errors) than data read during a sense operation performed using the previous 124 coding approach.

Figure 4A:
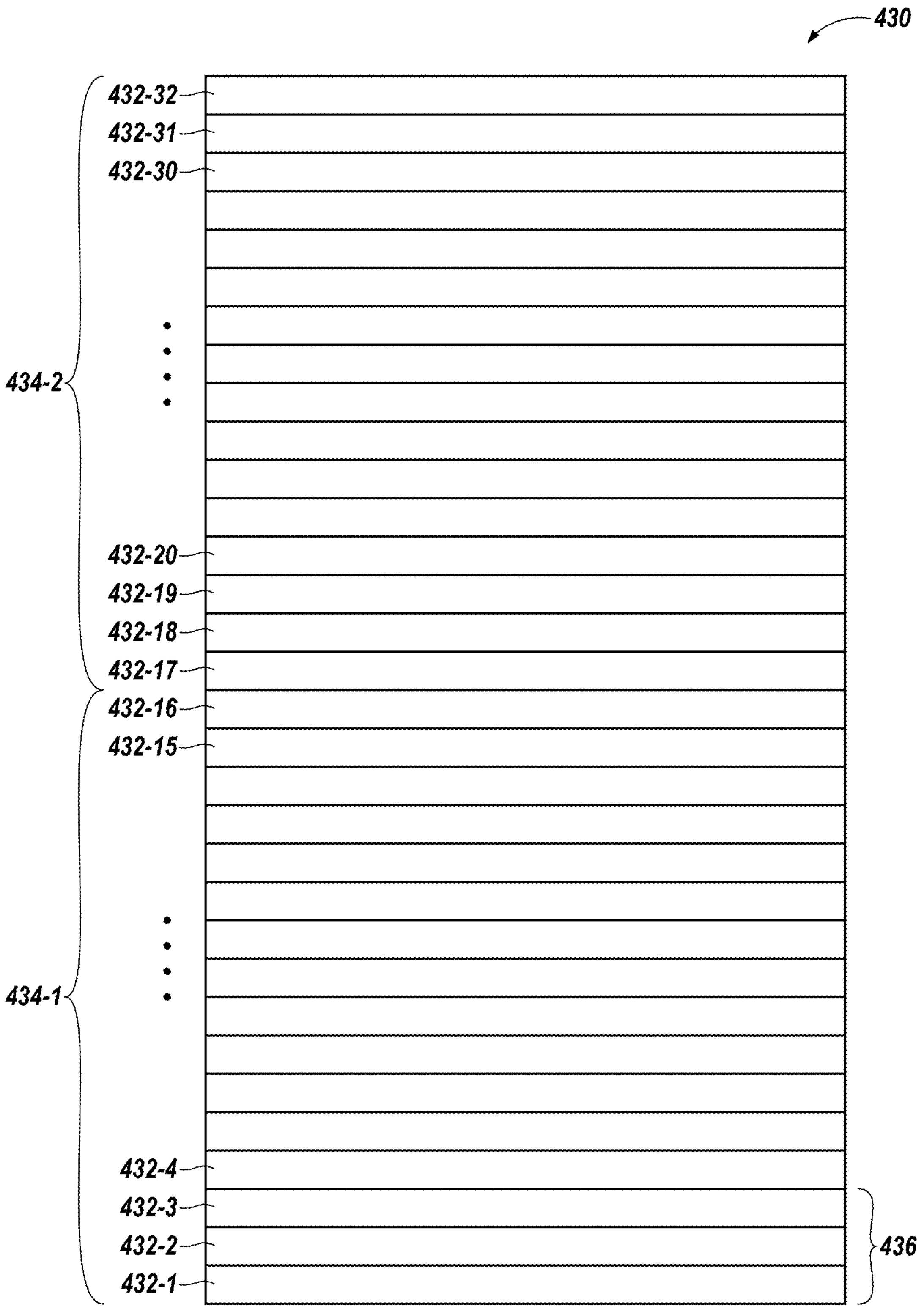
FIGS. 4A and 4B illustrate examples of a memory array upon which program operations in accordance with the present disclosure have been performed.
Figure 4B:
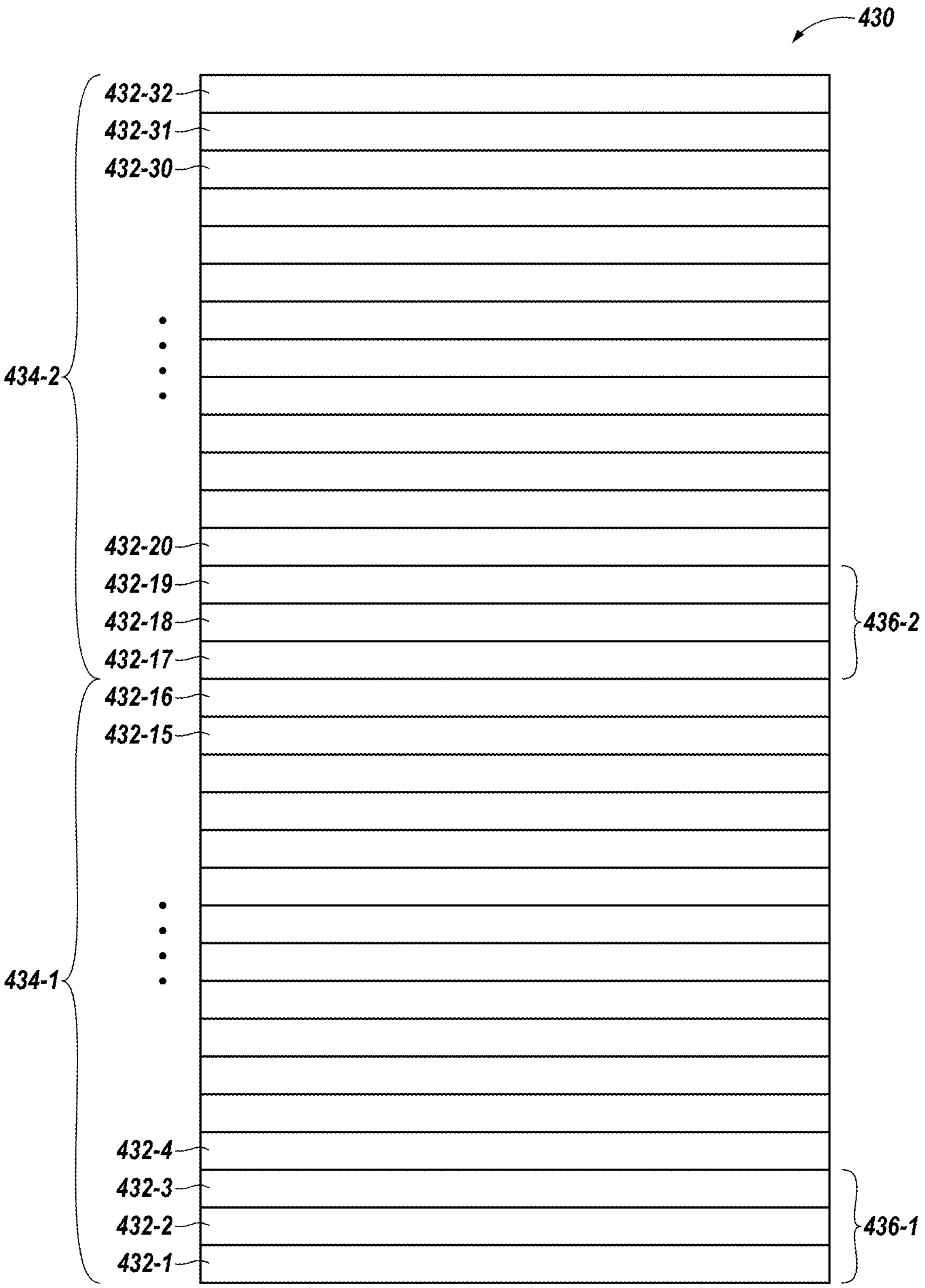

FIGS. 4A and 4B illustrate examples of a memory array 430 upon which program operations in accordance with the present disclosure have been performed. Memory array 430 can be, for instance, an array of memory cells of memory components 110 previously described in connection with FIG. 1. For example, as shown in FIGS. 4A and 4B, array 430 can include a plurality of access (e.g., word) lines 432-1, 432-2, 432-3, . . . , 432-31, 432-32 (which can be referred to collectively herein as word lines 432) to which the memory cells of the array 430 are coupled. Each respective word line can 432 can correspond to a different vertical level (e.g., tier) of array 430. For instance, in the examples illustrated in FIGS. 4A and 4B, array 430 includes 32 tiers. However, embodiments of the present disclosure are not limited to a particular number of word lines or tiers.

As shown in FIGS. 4A and 4B, array 430 can include a first deck 434-1 and a second deck 434-2. Deck 434-1 can include word lines 432-1 through 432-16, and deck 434-2 can include word lines 432-17 through 432-32. However, embodiments of the present disclosure are not limited to a particular number of decks.

In the example illustrated in FIG. 4A, a portion (e.g., zone) 436 of the word lines of deck 434-1 have been selected for a program operation (e.g., a two-pass program operation) in accordance with the present disclosure, and the selected program operation has been performed on that zone (e.g., on the memory cells coupled to the word lines of that zone). For instance, the program operation can be example program operation 1 or example program operation 2 previously described in connection with FIG. 1. The selected zone 436 can comprise less than all of the word lines of array 430 (e.g., less than all of the word lines of deck 434-1). For instance, in the example illustrated in FIG. 4A, zone 436 includes three word lines (e.g., word lines 432-1, 432-2, and 432-3) of deck 434-1. However, embodiments of the present disclosure are not limited to a particular number of word lines in a zone (e.g., in another example, zone 436 can include four word lines of deck 434-1). Zone 436 can be selected based on, for example, the error rate and/or temperature associated with the zone, as previously described herein (e.g., in connection with FIG. 1).

In the example illustrated in FIG. 4A, an additional (e.g., different type) of program operation can be performed on the remaining word lines (e.g., on the memory cells coupled to the remaining word lines) of array 430 that are not part of zone 436 (e.g., word lines 432-4 through 432-32). The additional program operation can be, for instance, a one-pass program operation.

In the example illustrated in FIG. 4A, an additional program operation (e.g., an additional two-pass program operation) in accordance with the present disclosure can be performed on word lines (e.g., on the memory cells coupled to the word lines) 432-1, 432-2, and/or 432-3. The additional program operation can be, for instance, example program operation 1 or example program operation 2 previously described in connection with FIG. 1. That is, different example program operations (e.g., both 1 and 2) can be performed on the word lines 432-1, 432-2, and/or 432-3 of zone 436, or only the same example program operation (e.g., either 1 or 2) can be performed on the word lines 432-1, 432-2, and/or 432-3 of zone 436.

In the example illustrated in FIG. 4B, a portion (e.g., zone) 436-1 of the word lines of deck 434-1 have been selected for a program operation (e.g., a two-pass program operation) in accordance with the present disclosure, a portion (e.g., zone) 436-2 of the word lines of deck 434-2 can be selected for a program operation (e.g., a two-pass program operation) in accordance with the present disclosure, and the selected program operations have been performed on those respective zones (e.g., on the memory cells coupled to the word lines of those zones). Zone 436-1 can comprise less than all of the word lines of deck 434-1, and zone 436-2 can comprise less than all of the word lines of deck 434-2. For instance, in the example illustrated in FIG. 4B, zone 436-1 includes three word lines (e.g., word lines 432-1, 432-2, and 432-3) of deck 434-1, and zone 436-2 includes three word lines (e.g., word lines 432-17, 432-18, and 432-19) of deck 434-2. However, embodiments of the present disclosure are not limited to a particular number of word lines in a zone. Zones 436-1 and 436-2 can be selected based on, for example, the error rate and/or temperature associated with the zones, as previously described herein (e.g., in connection with FIG. 1).

The program operation selected for and performed on zone 436-1 (e.g., on the word lines of zone 436-1) can be, for instance, example program operation 1 or example program operation 2 previously described in connection with FIG. 1, and the program operation selected for and performed on zone 436-2 (e.g., on the word lines of zone 436-2) can be, for instance, example program operation 1 or example program operation 2 previously described in connection with FIG. 1. For instance, example program operation 1 may have been performed on both zones 436-1 and 436-2, example program operation 2 may have been performed on both zones 436-1 and 436-2, example program operation 1 may have been performed on zone 436-1 and example program operation 2 may have been performed on zone 436-2, or example program operation 2 may have been performed on zone 436-1 and example program operation 1 may have been performed on zone 436-2. That is, the same example program operation (e.g., 1 or 2) may have been performed on the word lines of both zones 436-1 and 436-2, or different example program operations (e.g., 1 or 2) can be performed on the word lines of zones 436-1 and 436-2.

In the example illustrated in FIG. 4B, an additional (e.g., different type) of program operation can be performed on the remaining word lines (e.g., on the memory cells coupled to the remaining word lines) of array 430 that are not part of zone 436-1 or 436-2 (e.g., word lines 432-4 through 432-16 and word lines 432-20 through 432-32). The additional program operation can be, for instance, a one-pass program operation.

In the example illustrated in FIG. 4B, an additional program operation (e.g., an additional two-pass program operation) in accordance with the present disclosure can be performed on word lines (e.g., on the memory cells coupled to the word lines) 432-1, 432-2, and/or 432-3 of zone 436-1, and/or on word lines 432-17, 432-18, and 432-19 of zone 436-2. The additional program operation performed on word lines 432-1, 432-2, and/or 432-3 can be, for instance, example program operation 1 or example program operation 2 previously described in connection with FIG. 1, and the additional program operation performed on word lines 432-17, 432-18, and/or 432-19 can be, for instance, example program operation 1 or example program operation 2 previously described in connection with FIG. 1. That is, different example program operations (e.g., both 1 and 2) can be performed on the word lines 432-1, 432-2, and/or 432-3 of zone 436-1 and/or on the word lines 432-17, 432-18, and/or 432-19 of zone 436-2, or only the same example program operation (e.g., either 1 or 2) can be performed on the word lines 432-1, 432-2, and/or 432-3 of zone 436-1 and/or on the word lines 432-17, 432-18, and/or 432-19 of zone 436-2.

Figure 5:
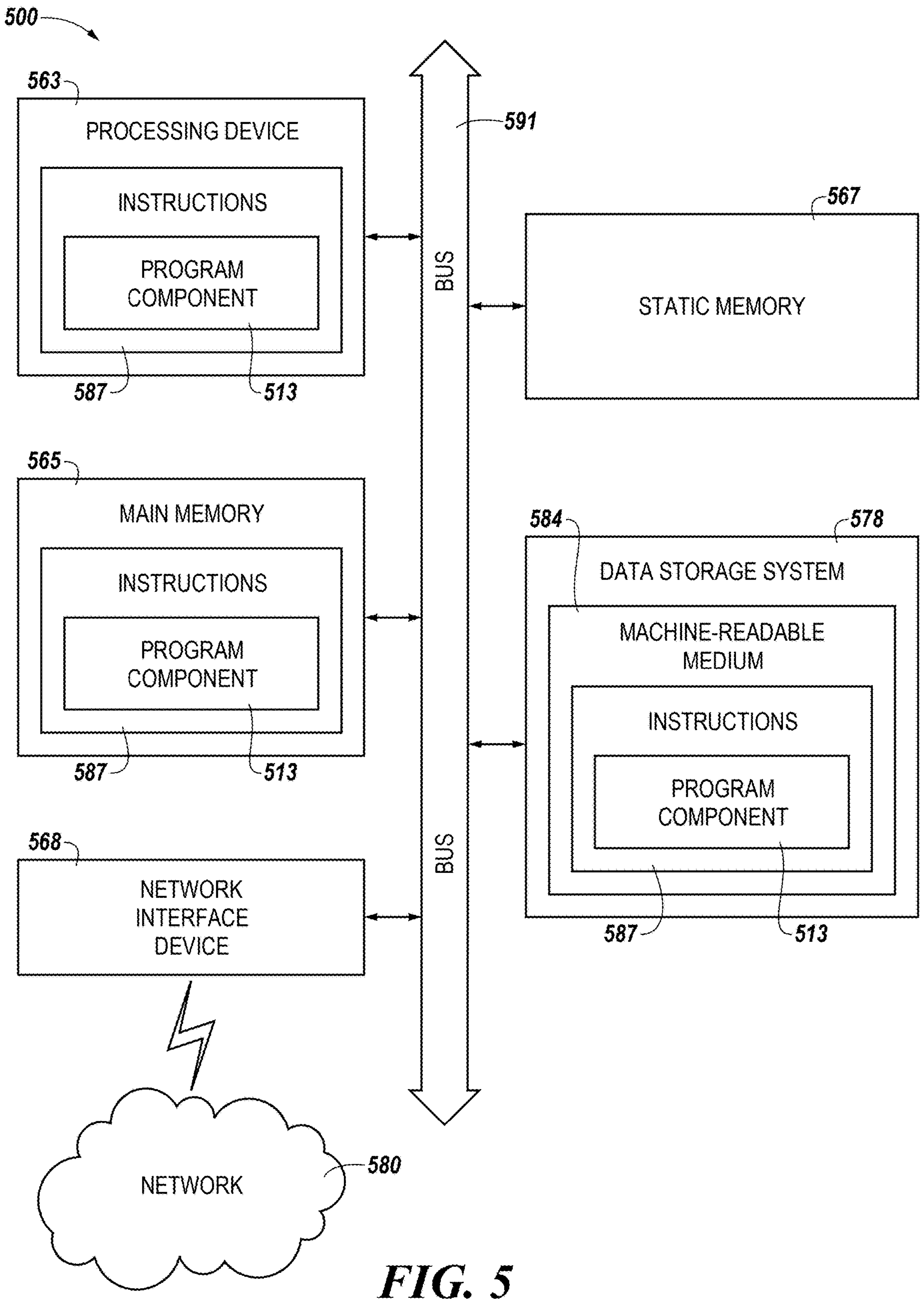
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., a program operation in accordance with the present disclosure). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 563, a main memory 565 (e.g., read-only memory (ROM), flash memory, dynamic random access memory (DRAM) such as synchronous DRAM (SDRAM) or Rambus DRAM (RDRAM), etc.), a static memory 567 (e.g., flash memory, static random access memory (SRAM), etc.), and a data storage system 578, which communicate with each other via a bus 591.

Processing device 563 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 563 can also be one or more special-purpose processing devices such as an application specific integrated circuit (ASIC), a field programmable gate array (FPGA), a digital signal processor (DSP), network processor, or the like. The processing device 563 is configured to execute instructions 587 for performing a program operation as discussed herein. The computer system 500 can further include a network interface device 468 to communicate over the network 580.

The data storage system 578 can include a machine-readable storage medium 584 (also known as a computer-readable medium) on which is stored one or more sets of instructions 587 or software embodying any one or more of the methodologies or functions described herein. The instructions 587 can also reside, completely or at least partially, within the main memory 565 and/or within the processing device 563 during execution thereof by the computer system 500, the main memory 565 and the processing device 563 also constituting machine-readable storage media. The machine-readable storage medium 584, data storage system 578, and/or main memory 565 can correspond to the memory sub-system 104 of FIG. 1.

In one embodiment, the instructions 587 include instructions to implement functionality corresponding to a program operation (e.g., program component 113 of FIG. 1). While the machine-readable storage medium 584 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:

an array of memory cells, wherein the array includes a plurality of access lines to which the memory cells are coupled, and wherein each respective one of the plurality of access lines corresponds to a different vertical level of the array; and a controller coupled to the array of memory cells to perform a program operation on the array of memory cells, wherein the program operation includes:

programming data to be stored in one page of memory cells of the array to the memory cells of the array coupled to a first one of the plurality of access lines;

programming additional data to be stored in the one page of memory cells of the array to the memory cells of the array coupled to a second one of the plurality of access lines, wherein the second one of the plurality of access lines is adjacent to the first one of the plurality of access lines;

sensing the data programmed to the memory cells of the array coupled to the first one of the plurality of access lines; and programming data to be stored in two pages of memory cells of the array to the memory cells of the array coupled to the first one of the plurality of access lines.

2. The memory sub-system of claim 1, wherein the program operation includes:

programming additional data to be stored in the one page of memory cells of the array to the memory cells of the array coupled to a third one of the plurality of access lines, wherein the third one of the plurality of access lines is adjacent to the second one of the plurality of access lines;

sensing the additional data to be stored in the one page of memory cells of the array and programmed to the memory cells of the array coupled to the second one of the plurality of access lines; and programming additional data to be stored in the two pages of memory cells of the array to the memory cells of the array coupled to the second one of the plurality of access lines.

3. The memory sub-system of claim 1, wherein:

the data and the additional data to be stored in the one page of memory cells of the array is single level cell (SLC) data; and the data to be stored in the two pages of memory cells of the array is multi-level cell (MLC) data.

4. The memory sub-system of claim 1, wherein the controller is to perform a sense operation on the array of memory cells, wherein the sense operation includes:

determining data stored in the one page of memory cells of the array using a first reference voltage;

determining data stored in a first one of the two pages of memory cells of the array using a second reference voltage, a third reference voltage, and a fourth reference voltage; and determining data stored in a second one of the two pages of memory cells of the array using a fifth reference voltage, a sixth reference voltage, and a seventh reference voltage.

5. The memory sub-system of claim 1, wherein the program operation includes:

loading the additional data to be stored in the one page of memory cells of the array after programming the data to be stored in the one page of memory cells of the array;

loading the data to be stored in the two pages of memory cells of the array after programming the additional data to be stored in the one page of memory cells of the array; and sensing the data programmed to the memory cells of the array coupled to the first one of the plurality of access lines after loading the data to be stored in the two pages of memory cells of the array.

6. A method of operating memory, comprising:

performing, by a controller of the memory, a program operation on an array of memory cells, wherein the program operation includes:

programming data to be stored in one page of memory cells of the array to memory cells of the array coupled to each of a plurality of adjacent access lines of the array; and programming data to be stored in two pages of memory cells of the array to the memory cells of the array coupled to each of the plurality of adjacent access lines of the array;

wherein the data to be stored in the two pages of memory cells of the array is programmed after the data to be stored in the one page of memory cells of the array is programmed; and wherein the program operation includes loading the data to be stored in the two pages of memory cells of the array after programming the data to be stored in the one page of memory cells of the array;

performing, by the controller, a sense operation on the array of memory cells, wherein the sense operation includes:

determining data stored in the one page of memory cells of the array using a first reference voltage;

determining data stored in a first one of the two pages of memory cells of the array using a second reference voltage, a third reference voltage, and a fourth reference voltage; and determining data stored in a second one of the two pages of memory cells of the array using a fifth reference voltage, a sixth reference voltage, and a seventh reference voltage.

7. The method of claim 6, wherein the plurality of adjacent access lines comprises a portion of the access lines of the array.

8. The method of claim 7, wherein the method includes performing, by the controller, an additional program operation on the array of memory cells, wherein the additional program operation includes programming additional data to be stored in additional pages of memory cells of the array to memory cells of the array coupled to the access lines of the array not included in the portion of the adjacent access lines.

9. The method of claim 6, wherein an error rate associated with the plurality of adjacent access lines of the array meets or exceeds a particular error rate threshold.

10. The method of claim 6, wherein a temperature of the plurality of adjacent access lines of the array is within a particular temperature range.

11. A memory sub-system, comprising:

an array of memory cells, wherein the array includes a plurality of access lines to which the memory cells are coupled; and controller coupled to the array of memory cells to:

select a portion of the plurality of access lines of the array for a program operation;

perform the program operation, wherein the program operation includes:

programming data to be stored in one page of memory cells of the array to the memory cells of the array coupled to a first one of the plurality of access lines included in the selected portion;

programming additional data to be stored in the one page of memory cells of the array to the memory cells of the array coupled to a second one of the plurality of access lines included in the selected portion, wherein the second one of the plurality of access lines is adjacent to the first one of the plurality of access lines in the selected portion;

sensing the data programmed to the memory cells of the array coupled to the first one of the plurality of access lines included in the selected portion; and programming data to be stored in two pages of memory cells of the array to the memory cells of the array coupled to the first one of the plurality of access lines included in the selected portion;

select an additional portion of the plurality of access lines of the array for an additional program operation; and perform the additional program operation.

12. The apparatus memory sub-system of claim 11, wherein the additional program operation includes:

programming data to be stored in an additional one page of memory cells of the array to the memory cells of the array coupled to a first one of the plurality of access lines included in the selected additional portion;

programming additional data to be stored in the additional one page of memory cells of the array to the memory cells of the array coupled to a second one of the plurality of access lines included in the selected additional portion, wherein the second one of the plurality of access lines is adjacent to the first one of the plurality of access lines in the selected additional portion;

sensing the data programmed to the memory cells of the array coupled to the first one of the plurality of access lines included in the selected additional portion; and programming data to be stored in an additional two pages of memory cells of the array to the memory cells of the array coupled to the first one of the plurality of access lines included in the additional selected portion.

13. The memory sub-system of claim 11, wherein the additional program operation includes:

programming data to be stored in an additional one page of memory cells of the array to the memory cells of the array coupled to each of the plurality of access lines included in the selected additional portion; and programming data to be stored in an additional two pages of memory cells of the array to the memory cells of the array coupled to each of the plurality of access lines included in the selected additional portion;

wherein the data to be stored in the additional two pages of memory cells of the array is programmed after the data to be stored in the additional one page of memory cells of the array is programmed.

14. The memory sub-system of claim 11, wherein:

the portion of the plurality of access lines of the array are included in a first deck of the array; and the additional portion of the plurality of access lines of the array are included in a second deck of the array.

15. The memory sub-system of claim 11, wherein the controller is to perform an additional program operation on the selected portion, wherein the additional program operation performed on the selected portion includes:

programming data to be stored in the one page of memory cells of the array to the memory cells of the array coupled to each of the plurality of access lines included in the selected portion; and programming data to be stored in the two pages of memory cells of the array to the memory cells of the array coupled to each of the plurality of access lines included in the selected portion.

16. The memory sub-system of claim 11, wherein the controller is to select the portion of the plurality of access lines of the array for the program operation based on an error rate associated with the portion of the plurality of access lines.

17. The memory sub-system of claim 11, wherein the controller is to select the portion of the plurality of access lines of the array for the program operation based on a temperature of the portion of the plurality of access lines.

* * * * *